United States Patent

Imai et al.

[11] Patent Number: 6,093,518
[45] Date of Patent: Jul. 25, 2000

[54] VISIBLE LASER-CURABLE COMPOSITION

[75] Inventors: Genji Imai, Hiratsuka; Hideo Kogure, Atsugi, both of Japan

[73] Assignee: Kansai Paint Co., Ltd., Amagasaki, Japan

[21] Appl. No.: 09/245,028

[22] Filed: Feb. 5, 1999

[30] Foreign Application Priority Data

Feb. 9, 1998 [JP] Japan ................................. 10-026796

[51] Int. Cl.[7] ........................... G03F 7/029; G03F 7/031; G03F 7/028; G03F 7/30; G03C 1/675
[52] U.S. Cl. ...................... 430/287.1; 430/926; 430/947; 430/925; 430/325; 430/945
[58] Field of Search .............................. 430/281.1, 286.1, 430/287.1, 270.1, 285.1, 913, 915, 926, 925, 947, 945, 331, 325, 306; 522/26, 28, 29, 79, 153

[56] References Cited

U.S. PATENT DOCUMENTS 5,045,434  9/1991  Yoshihara et al. ........................ 430/286

FOREIGN PATENT DOCUMENTS

| 0 704 764 A1 | 4/1996 | European Pat. Off. . |
| 3-223759 | 10/1991 | Japan . |
| 06192309 | 7/1994 | Japan . |
| 6-301208 | 10/1994 | Japan . |
| 8-9644 | 1/1996 | Japan . |
| 08106161 | 4/1996 | Japan . |

OTHER PUBLICATIONS

Yanagase et al. 125:100191, File HCA of STN Database SVC, Chemical Abstracts, American Chemical Society, 1996, pp. 17–18 (English abstract of JP 08106161).

Yanagase et al. 1996–256390, Online, Derwent Abstract, File WPAT, 1996 (English abstract of JP 08106161).

Yamaoka et al. 122:82947, File HCA of STN Database SVC, Chemical Abstracts, American Chemical Society, 1994, pp. 24–26 (English abstract of JP 06192309).

*Primary Examiner*—Janet Baxter
*Assistant Examiner*—Sin J. Lee
*Attorney, Agent, or Firm*—Wenderoth, Lind & Ponack, L.L.P.

[57] ABSTRACT

The present invention provides a visible laser-curable photosensitive composition wherein a photocuring resin having photosensitive group which is crosslinkable or polymerizable upon light exposure, is mixed with a photopolymerization inititor system consisting of a coumarin type pigment of particular structure and a titanocene compound. This composition has an unexpectedly high sensitivity to visible laser.

10 Claims, No Drawings

VISIBLE LASER-CURABLE COMPOSITION

BACKGROUND OF THE INVENTION

1. Field of the Invention

The present invention relates to a visible laser-curable composition. More particularly, the present invention relates to a visible laser-curable composition having very high sensitivity to a laser beam having a wavelength of 488 nm.

2. Description of the Prior Art

In recent years, visible laser-curable compositions have come to be used as image-forming photosensitive materials such as photoresist, plate material and the like. A method for image formation by direct writing using a light source of high energy density, for example, a laser, has merits in that not only the energy conversion efficiency is high but also the image-forming step is significantly simplified.

Hence, it is desired to develop a visible laser-curable composition which has high sensitivity to and can be subjected to scanning exposure with a visible laser giving an oscillation line stable in durability and intensity, particularly an Ar laser having a stable oscillation line in a visible wavelength region of 488 nm or 514.5 nm.

Various proposals were made to respond to the above demand. For example, compositions using a photopolymerization inititor system consisting of a particular ketocoumar in type sensitizer and a polymerization initiator are disclosed in Japanese Laid-Open Patent Publication No. 223759/1991 (corresponding to U.S. Pat. No. 5,045,434), Japanese Laid-Open Patent Publication No. 301208/1994, Japanese Patent Publication No. 9644/1996, etc.

The above compositions using a photopolymerization initiator system have polymerization initiatability to a light of visible region; however, their sensitivity is not sufficient and need to be improved for laser curing which is complete in a very short period of time. Therefore, it is desired in the art to develop a more practical photopolymerization initiator system having higher sensitivity.

SUMMARY OF THE INVENTION

The present inventors made a study in order to solve the above-mentioned problems of the prior art. As a result, the present inventors now found out that a photosensitive composition comprising a combination of a coumarin type pigment of particular structure and a titanocene compound has unexpectedly high sensitivity to visible laser. The present invention has been completed based on the finding.

According to the present invention there is provided a visible laser-curable composition comprising:

(A) a photocuring resin having photosensitive group which is crosslinkable or polymerizable upon light exposure, (B) a sensitizer selected from the group consisting of the compounds represented by the following general formula (I) and (II):

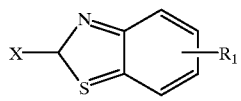

(I)

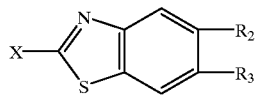

(II)

wherein X is

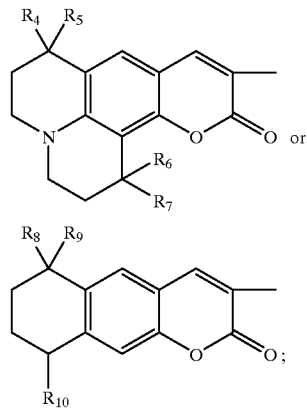

$R_1$ is an alkyl group of 1–4 carbon atoms, an alkoxy group of 1–4 carbon atoms, an alkoxycarbonyl group of 2–5 carbon atoms, $—C_nF_{2n+1}$ (in which n is an integer of 1–4), a di-alkylamino group in which each alkyl moiety has 1–4 carbon atoms, Cl, Br, —CN, $—NO_2$ or $—SO_2CH_3$;

$R_2$ and $R_3$ are each independently an alkyl group of 1–4 carbon atoms, an alkoxy group of 1–4 carbon atoms, an alkoxycarbonyl group of 2–5 carbon atoms, a di-alkylamino group in which each alkyl moiety has 1–4 carbon atoms, Cl or Br; and $R_4$, $R_5$, $R_6$, $R_7$, $R8R_9$ and $R_{10}$ are each independently an alkyl group of 1–3 carbon atoms, and (C) a titanocene compound represented by the following general formula (III):

(III)

wherein two $R_{11}$s are each independently a cyclopentadienyl group which may be optionally substituted with 1–2 methyl groups; and $R_{12}$ and $R_{13}$ are each independently a group represented by the following formula:

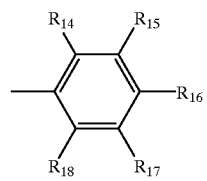

in which $R_{14}$ is a fluorine atom, $—CF_3$ or $—CF_2CH_3$; and $R_{15}$, $R_{16}$, $R_{17}$ and $R_{18}$ are each independently a hydrogen atom, a fluorine atom, $—CF_3$, $—CF_2CH_3$, an alkyl group of 1–12 carbon atoms, an alkoxy group of 1–12 carbon atoms, a 6-membered carbocyclic aromatic group or a 5- or 6-membered heterocyclic aromatic group.

The visible laser-curable composition according to the present invention may further comprise:

(D) at least one nitrogen-containing compound selected from the group consisting of the compounds represented by the following general formulas (1) to (6):

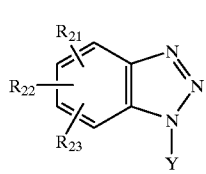
(1)

wherein Y is a hydrogen atom or a hydroxyl group; and $R_{21}$, $R_{22}$ and $R_{23}$ are each independently a hydrogen atom, a chlorine atom or an alkyl group of 1–6 carbon atoms,

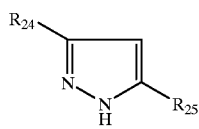
(2)

wherein $R_{24}$ and $R_{25}$ are each independently a hydrogen atom or an alkyl group of 1–6 carbon atoms,

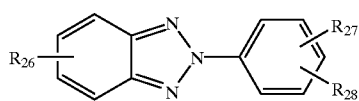
(3)

wherein $R_{26}$, $R_{27}$ and $R_{28}$ are each independently a hydrogen atom, a hydroxyl group or an alkyl group of 1–12 carbon atoms,

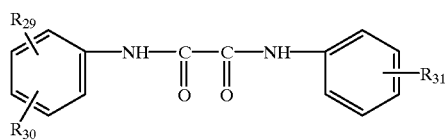
(4)

wherein $R_{29}$, R30 and $R_{31}$ are each independently a hydrogen atom, a hydroxyl group, an alkyl group of 1–12 carbon atoms or an alkoxy group of 1–12 carbon atoms,

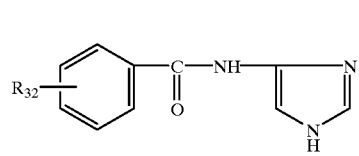
(5)

wherein $R_{32}$ is a hydrogen atom, a hydroxyl group, an alkyl group of 1–12 carbon atoms or an alkoxy group of 1–12 carbon atoms, and

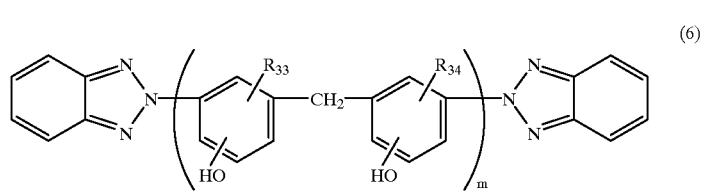
(6)

wherein $R_{33}$ and $R_{34}$ are each independently a hydrogen atom or an alkyl group of 1–12 carbon atoms; and m is an integer of 1–3.

DETAILED DESCRIPTION OF THE INVENTION

The present invention is described in more detail below.
Photocuring Resin (A)

The photocuring resin (A) used in the present invention is a resin having photosensitive group which is crosslinkable or polymerizable upon light exposure.

Such a photosensitive group present in the photocuring resin (A) is a group which can initiate crosslinking or polymerization upon light exposure in the presence of a sensitizer (B) and a titanocene compound (C). Specific examples of the photosensitive group having such a property are (meth)acryloyl group [$CH_2$=CR—CO—(wherein R is a hydrogen atom or a methyl group)], cinnamoyl group, allyl group, azido group and cinnamylidene group.

The photocuring resin (A) can have a number-average molecular weight of generally 1,000–100,000, preferably 3,000–50,000, and preferably has a glass transition temperature (Tg) of –20° C. or higher, particularly –10° C. to 70° C., more particularly 0–40° C. because the resist film obtained shows no tackiness.

Specific description is made below on the production of the photocuring resin (A) used in the present invention.
(a) Photocuring Resin (A-1) Having (meth)acryloyl Group as the Photosensitive Group:

The photocuring resin (A-1) can be produced, for example, by adding a glycidyl group-containing unsaturated compound to a carboxyl group-containing acrylic resin.

The carboxyl group-containing acrylic resin can be obtained, for example, by copolymerizing an α,β- ethylenically unsaturated acid (as an essential monomer component) such as acrylic acid, methacrylic acid or the like with at least one unsaturated monomer selected from (meth) acrylic acid esters such as methyl (meth)acrylate, ethyl (meth)acrylate, propyl (meth)acrylate, butyl (meth)acrylate, 2-ethylhexyl (meth)acrylate, hydroxyethyl (meth)acrylate and the like; styrene; (meth)acrylonitrile; (meth)acrylamide; etc.

The glycidyl group-containing unsaturated compound to be added to the carboxyl group-containing acrylic resin includes, for example, glycidyl acrylate, glycidyl methacrylate and allyl glycidyl ether.

The addition reaction between the carboxyl group-containing acrylic resin and the glycidyl group-containing unsaturated compound can be easily conducted according to a per se known process, for example, by reacting them in the presence of a catalyst such as tetraethylammonium bromide or the like at 80–120° C. for 1–5 hours.

The photocuring resin (A-1) can also be produced by adding a reaction product between a hydroxyl group-containing polymerizable unsaturated compound and a diisocyanate compound, to a hydroxyl group-containing acrylic resin.

The hydroxyl group-containing polymerizable unsaturated compound includes, for example, hydroxyalkyl (meth) acrylates such as 2-hydroxyethyl acrylate, 2-hydroxyethyl methacrylate, 2-hydroxypropyl acrylate and the like; and N-methylolacrylamide. The diisocyanate compound includes, for example, tolylene diisocyanate, xylylene diisocyanate, hexamethylene diisocyanate and lysine diisocyanate. The hydroxyl group-containing acrylic resin can be obtained by copolymerizing the above-mentioned hydroxyl group-containing polymerizable unsaturated compound (as an essential monomer component) with at least another unsaturated monomer such as mentioned previously.

The hydroxyl group-containing polymerizable unsaturated compound and the diisocyanate compound can be reacted at a nearly equimolar ratio. The addition reaction of the resulting reaction product with the hydroxyl group-containing acrylic resin can be conducted according to a per se known process by reacting them in a nitrogen gas atmosphere at 50–100° C.

(b) Photocuring Resin (A-2) Having Cinnamoyl Group as the Photosensitive Group:

The photocuring resin (A-2) can be produced, for example, by reacting a hydroxyl group-containing acrylic resin with a substituted or unsubstituted cinnamic acid halide in the presence of a base in, for example, a pyridine solution.

The hydroxyl group-containing acrylic resin can be obtained by copolymerizing a hydroxyl group-containing polymerizable unsaturated compound (as an essential monomer component) such as mentioned in the above (a), with at least another unsaturated monomer.

The substituted or unsubstituted cinnamic acid halide includes cinnamic acid halides which may have, on the benzene ring, 1–3 substituents selected from nitro group, lower alkoxy groups, etc. Specific examples thereof are cinnamic acid chloride, p-nitrocinnamic acid chloride, p-methoxycinnamic acid chloride and p-ethoxycinnamic acid chloride.

The subsitututed or unsubstituted cinnamic acid halide can be used in an amount of generally 6–180 parts by weight, preferably 30–140 parts by weight per 100 parts by weight of the hydroxyl group-containing acrylic resin. The reaction of the hydroxyl group-containing acrylic resin with the subsitututed or unsubstituted cinnamic acid halide can be conducted according to a per se known process, for example, by reacting them in the presence of a base such as pyridine solvent or the like at 30–70° C.

(c) Photocuring Resin (A-3) Having Allyl Group as the Photosensitive Group:

The photocuring resin (A-3) can be produced, for example, by adding allyl glycidyl ether

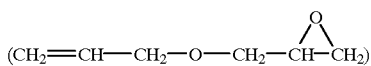

to a carboxyl group-containing acrylic resin such as mentioned in the above (a), or by adding a reaction product between (meth)allyl alcohol and diisocyanate compound, to the above-mentioned hydroxyl group-containing acrylic resin.

(d) Other Photocuring Resins

For example, prepolymers such as polyethylene glycol diacrylate, polypropylene glycol diacrylate and the like can as well be used as the photocuring resin (A).

Sensitizer (B)

The sensitizer (B) used in the present invention is selected form the group consisting of the compounds represented by the following general formula (I) and (II).

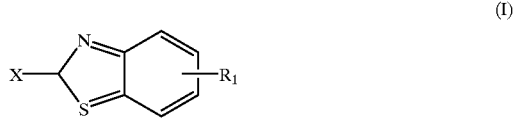

(I)

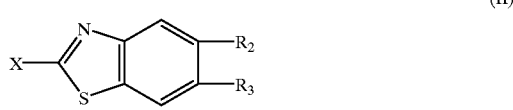

(II)

wherein X is

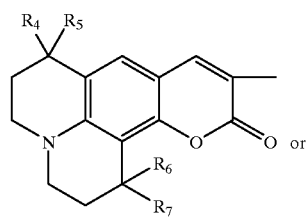

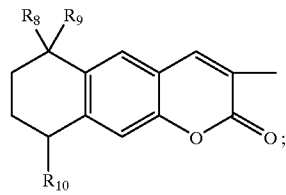

$R_1$ is an alkyl group of 1–4 carbon atoms, an alkoxy group of 1–4 carbon atoms, an alkoxycarbonyl group of 2–5 carbon atoms, —$C_nF_{2n+1}$ (in which n is an integer of 1–4), a di-alkylamino group in which each alkyl moiety has 1–4 carbon atoms, Cl, Br, —CN, —$NO_2$ or —$SO_2CH_3$;

$R_2$ and $R_3$ are each independently an alkyl group of 1–4 carbon atoms, an alkoxy group of 1–4 carbon atoms, an alkoxycarbonyl group of 2–5 carbon atoms, a di-alkylamino group in which each alkyl moiety has 1–4 carbon atoms, Cl or Br; and $R_4$, $R_5$, $R_6$, $R_7$, $R_8$, $R_9$ and $R_{10}$ are each independently an alkyl group of 1–3 carbon atoms.

As examples of the compounds of the above general formula (I),

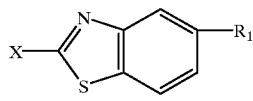

and

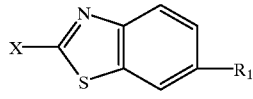

wherein X and $R_1$ has the same meanings as defined above, may be named.

As $R_1$ in the former of the above two compounds, —$CH_3$, —$OCH_3$, di-alkylamino group in which each alkyl moiety has 1–4 carbon atoms, Cl, —$CF_3$, —$COOCH_3$, —CN, —$SO_2CH_3$ and —$NO_2$ are preferred.

As $R_1$ in the latter compound, —$N(C_2H_5)_2$, —$OCH_3$, —$CH_3$ and —$NO_2$ are preferred.

Furthermore, as examples of the compounds of the above general formula (II),

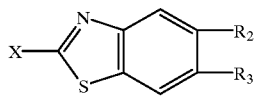

can be named, preferred $R_2$ and $R_3$ being —$CH_3$, —$OCH_3$ and Cl.

The sensitizer (B) can be used in an amount of generally 0.1–10 parts by weight, preferably 0.3–6 parts by weight, more preferably 0.5–3 parts by weight per 100 parts by weight (as solid content) of the photocuring resin (A).

Titanocene Compound (C)

In the present invention, there can be used, as the titanocene compound (C), those compounds represented by the following general formula (Ill):

(III)

wherein two $R_{11}$s are each independently a cyclopentadienyl group which may be optionally substituted with 1–2 methyl groups; and $R_{12}$ and $R_{13}$ are each independently a group represented by the following formula:

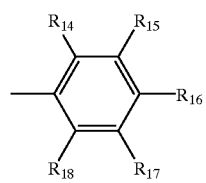

wherein $R_{14}$ is a fluorine atom, —$CF_3$ or 13 $CF_2CH_3$; and $R_{15}$, $R_{16}$, $R_{17}$ and $R_{18}$ are each independently a hydrogen atom, a fluorine atom, —$CF_3$, 13 $CF_2CH_3$, an alkyl group of 1–12 carbon atoms, an alkoxy group of 1–12 carbon atoms, a 6-membered carbocyclic aromatic group or a 5- or 6-membered heterocyclic aromatic group (e.g. 1-pyrrolyl).

Specific examples of the above titanocene compounds are the following compounds.

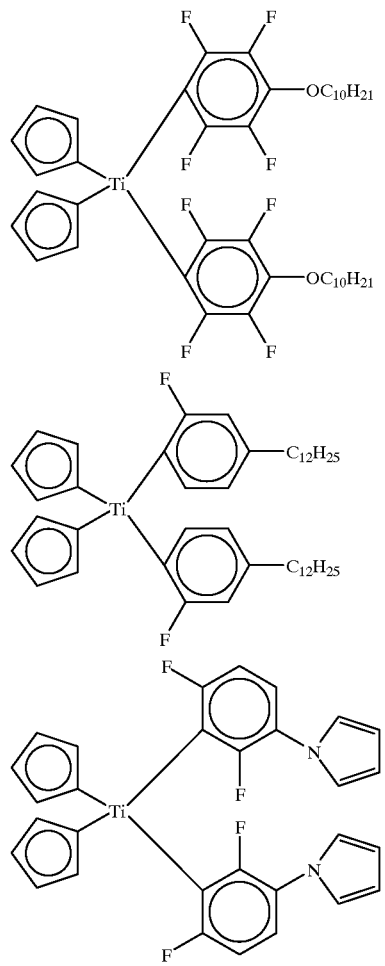

The amount of the titanocene compound (C) used can be generally 0.1–10 parts by weight, preferably 0.5–7.5 parts by weight, more preferably 1–5 parts by weight per 100 parts by weight (as solid content) of the photocuring resin (A).

(D) Nitrogen-Containing Compound

The visible laser-curable composition of the present invention can further comprise, if necessary, at least one nitrogen-containing compound selected from the group consisting of the compounds represented by the following general formulas (1) to (6):

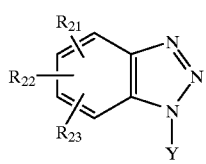

(1)

wherein Y is a hydrogen atom or a hydroxyl group; and $R_{21}$, $R_{22}$ and $R_{23}$ are each independently a hydrogen atom, a chlorine atom or an alkyl group of 1–6 carbon atoms, (2)

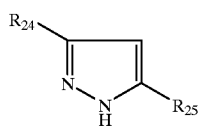

wherein $R_{24}$ and $R_{25}$ are each independently a hydrogen atom or an alkyl group of 1–6 carbon atoms, (3)

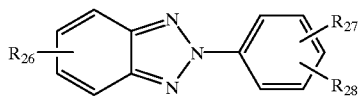

wherein $R_{26}$, $R_{27}$ and $R_{28}$ are each independently a hydrogen atom, a hydroxyl group or an alkyl group of 1–12 carbon atoms, (4)

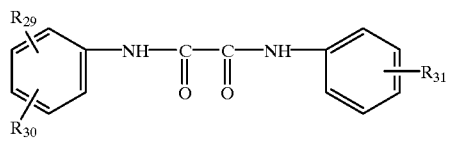

wherein $R_{29}$, $R_{30}$ and $R_{31}$ are each independently a hydrogen atom, a hydroxyl group, an alkyl group of 1–12 carbon atoms or an alkoxy group of 1–12 carbon atoms, (5)

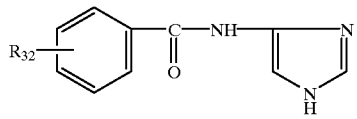

wherein $R_{32}$ is a hydrogen atom, a hydroxyl group, an alkyl group of 1–12 carbon atoms or an alkoxy group of 1–12 carbon atoms, and (6)

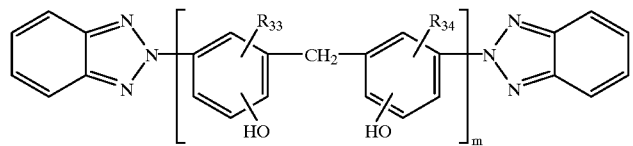

wherein $R_{33}$ and $R_{34}$ are each independently a hydrogen atom or an alkyl group of 1–12 carbon atoms; and m is an integer of 1–3.

The compounds represented by the general formula (1) include, for example, benzotriazoles such as the followings.

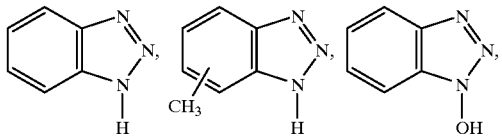

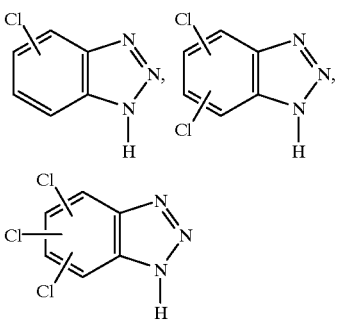

The compounds represented by the general formula (2) include, for example, pyrazoles such as the followings.

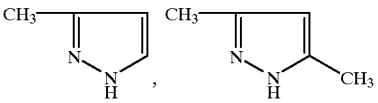

The compounds represented by the general formula (3) include, for example, the followings.

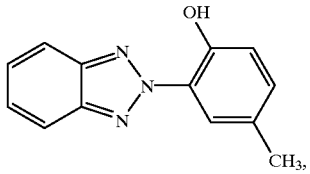

-continued

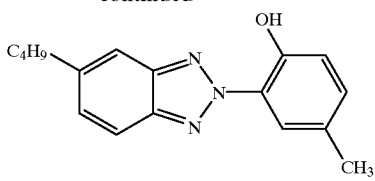

The compounds represented by the general formula (4) include, for example, the followings.

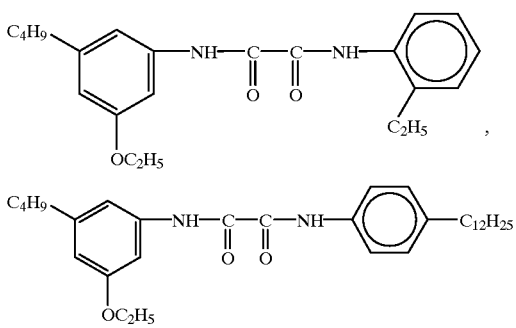

The compounds represented by the general formula (5) include, for example, the followings.

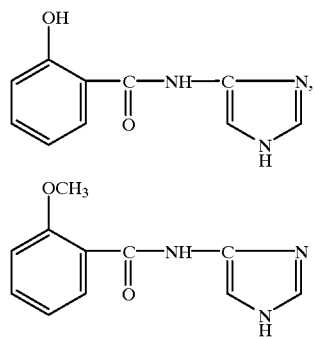

The compounds represented by the general formula (6) include, for example, the following.

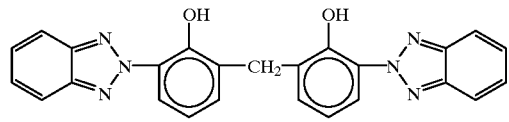

Of the above-mentioned nitrogen-containing compounds, particularly preferable in the present invention are benzotriazoles represented by the general formula (1).

The nitrogen-containing compound (D) can be used as a single compound or in combination of two or more compounds. The amount of the nitrogen-containing compound (D) optionally used can be generally 0.01–20 parts by weight, preferably 0.05–15 parts by weight, more preferably 0.1–10 parts by weight per 100 parts by weight (as solid content) of the photocuring resin (A).

The present visible laser-curable composition, when comprising the nitrogen-containing compound (D), can have higher sensitivity and accordingly can give an image of higher resolution.

The present composition can further comprise, if necessary, an ethylenically unsaturated compound, a coloring agent, a plasticizer, a levelling agent, etc.

As the ethylenically unsaturated compounds, those monomers, dimers, trimers and other oligomers having at least one, preferably one to four, ethylenically unsaturated double bond(s) which undergo addition polymerization in the occasion of exposure to bring about insolubilization of the exposed part can be used. Specific examples of such compounds include, for example, acrylic acid, methacrylic acid, ethylene glycol di(meth)acrylate, diethylene glycol di(meth)acrylate, triethylene glycol di(meth)acrylate, tetra- and higher poly (4–16) ethylene glycol di(meth)acrylate, propylene glycol di(meth)acrylate, trimethylolpropane tri (meth)acrylate, pentaerythritol tetra(meth)acrylate, ethylene glycol diitaconate, ethylene glycol dimaleate, hydroquinone di(meth)acrylate, resorcinol di(meth)acrylate, pyrogallol (meth)acrylate, oligourethane acrylate, oligoepoxy acrylate and divinylbenzene.

The amount of use of these ethylenically unsaturated compounds is generally no more than 200 parts by weight, preferably 3–50 parts by weight, per 100 parts by weight (as solid content) of the photocuring resin (A). These ethylenically unsaturated compounds may be used either singly or in combination of two or more.

The visible laser-curable composition of the present invention can be made into a visible laser-curable coating film by a per se known method of ordinary use, for example, a method which comprises mixing the above-mentioned individual components, dissolving the mixture in a solvent (finely dispersing when a pigment is used as a coloring agent), coating the solution (or a dispersion) on a substrate by the use of a coating machine (e.g. roller, roll coater or spin coater), and drying the resulting film.

The solvent usable includes, for example, etones (e.g. acetone, methyl ethyl ketone and methyl isobutyl ketone), esters (e.g. ethyl acetate, butyl cetate, methyl benzoate and methyl propionate), ethers (e.g. tetrahydrofuran, dioxane and dimethoxyethane), ellosolves (e.g. methyl cellosolve, ethyl cellosolve nd diethylene glycol monomethyl ether), aromatic hydrocarbons (e.g. benzene, toluene, xylene and ethylbenzene), halgoenated hydrocarbons (e.g. chloroform, trichloroethylene and dichloromethane), alcohols (e.g. ethyl alcohol and benzyl alcohol) and others (e.g. dimethylformamide and dimethylsulfone oxime).

As the substrate, there can be used, for example, metal sheets of aluminum, magnesium, copper, zinc, chromium, nickel, iron or the like, or alloy sheets composed of these metals; base materials whose surfaces are treated with one of these metals; polymer sheets; glass; silicon wafer; and carbon.

The thickness of the visible laser-curable coating film formed on the substrate can be generally 1–40 μm, preferably 1–30 μm, more preferably 1–20 μm. The visible laser-curable coating film formed on the substrate is image-wise exposed to a visible laser and cured; the unexposed and uncured portion of the coating film is subjected to a development treatment and removed; thereby, an image (e.g. a resist pattern) can be formed on the substrate.

As the visible laser, there can be used a laser having an oscillation line in a visible region, for example, an Ar laser or a helium-cadmium laser both having an oscillation line in a 400–550 nm wavelength region. The dose of the laser applied differs depending upon, for example, the thickness of the curable coating film, but can be generally 1–20 mJ/cm², preferably 3–15 mJ/cm², more preferably 5–10 mJ/cm².

The development treatment after light exposure can be conducted, for example, by immersing the visible laser-exposed coating film in an alkali developer (e.g. a 0.5–1 wt. % aqueous sodium carbonate solution), or by spraying the solution on the coating film.

The visible laser-curable composition of the present invention can be applied to wide applications such as photoresist, material for lithography or letter-press, presensitized plate for offset printing, information recording material, material for relief image production, and the like.

The present invention is described more specifically below by way of Examples. In the Examples, "parts" refer to parts by weight.

Synthesis of Photocuring Resin (A)

A mixture consisting of 40 parts of methyl methacrylate, 40 parts of butyl acrylate, 20 parts of acrylic acid and 2 parts of azobsisobutyronitrile was dropwise added, in 3 hours, to 90 parts of propylene glycol monomethyl ether kept at 110° C. in a nitrogen gas atmosphere. The resulting mixture was subjected to aging for 1 hour. Thereto was dropwise added, in 1 hour, a mixture consisting of 1 part of azobisdimethylvaleronitrile and 10 parts of propylene glycol monomethyl ether. The resulting mixture was subjected to aging for 5 hours to obtain an acrylic resin solution.

To the solution were added 24 parts of glycidyl methacrylate, 0.12 part of hydroquinone and 0.6 part of tetraethylammonium bromide. The resulting mixture was subjected to a reaction at 110° C. for 5 hours while blowing air thereinto, to obtain a solution of a photocuring resin having a Tg of 20° C. and a number-average molecular weight of about 20,000.

EXAMPLE 1

180 part (100 parts as solid content) of the photocuring resin solution obtained in the above synthesis was dissolved in 290 parts of ethyl acetate. To the resulting solution was added a solution of 2 part of the following sensitizer

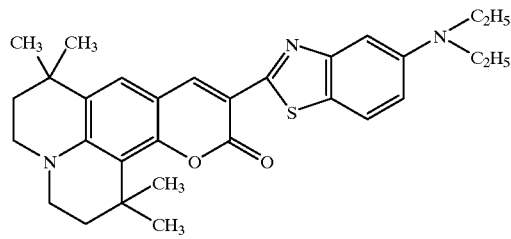

and 1 part of the following titanocene compound (polymerization initiator)

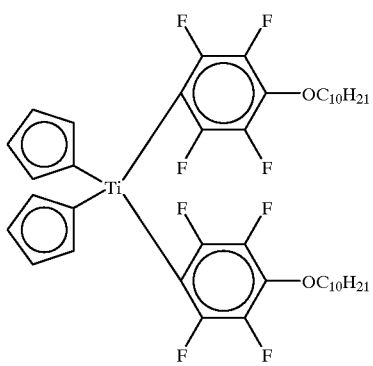

dissolved in 5 part of benzyl alcohol. The resulting mixture was thoroughly stirred to obtain a uniform mixed solution.

The above-obtained solution was coated, by the use of a bar coater, on a glass fiber-reinforced epoxy substrate [square sheet of 2 mm (thickness)×350 mm×460 mm] having a 18 μm-thick copper layer, and dried at 60° C. for 10 minutes to obtain a resist film having a thickness of 10 μm as dried. Thereon was coated an aqueous polyvinyl alcohol solution by the use of a bar coater so as to give a film having a thickness of 3 μm as dried, followed by drying at 60° C. for 10 minutes.

The resulting substrate was subjected to scanning exposure through a 21 step-wedge film by the use of an Ar ion laser of 488 nm wavelength so that the exposure became 3 mJ/cm².

The resist-coated substrate after light exposure was heated at 60° C. for 10 minutes in a hot-air drying chamber, and then immersed in a 1% aqueous sodium carbonate solution of 30° C. for 1 minute to remove the uncured portion of the resist. The sensitivity of the remaining resist was Step No. 10 as measured using Kodak Photographic Step Tablet (a larger value indicates higher sensitivity).

EXAMPLE 2

A resist-coated substrate was produced and tested in the same manner as in Example 1 except that 2 parts of the following sensitizer and 5 parts of trimethylolpropane triacrylate were used instead of the sensitizer of Example 1.

The sensitivity (Step Tablet) of the remaining resist was Step No. 10.

EXAMPLE 3

A resist-coated substrate was produced and tested in the same manner as in Example 1 except that the sensitizer used in Example 1 was changed to 1 part of a sensitizer of the following formula:

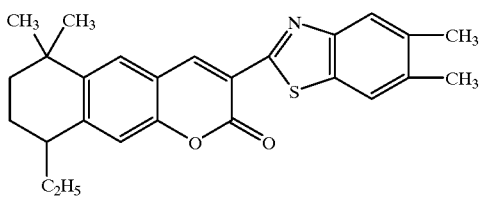

The sensitivity (Step Tablet) of the remaining resist was Step No. 9.

EXAMPLE 4

A resist-coated substrate was produced and tested in the same manner as in Example 1 except that 5 parts of the following benzotriazole

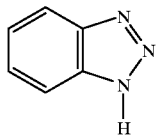

was added to the mixed solution prepared in Example 1.

The sensitivity (Step Tablet) of the remaining resist was Step No. 10.

As stated above, the visible laser-curable composition of the present invention can form a uniform and smooth coating film on a substrate because the base resin and sensitizer used therein have good compatibility with each other and are soluble in a desired solvent. Further, the present composition has very high sensitivity to a visible laser, for example, an Ar laser having an oscillation line at 488 nm or 514.5 nm, and accordingly can be subjected to high-speed scanning exposure by such a laser and yet can form an image of very fine resolution.

What is claimed is:

1. A visible laser-curable composition comprising:

(A) a photocuring resin having photosensitive group which is crosslinkable or polymerizable upon light exposure, (B) a sensitizer selected from the group consisting of the compounds represented by the following formulas:

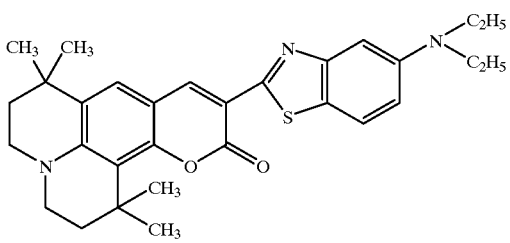

and

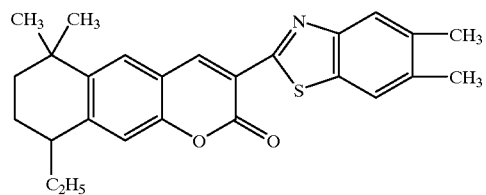

and (C) a titanocene compound represented by the following general formula (III):

wherein two $R_{11}$s are each independently a cyclopentadienyl group which may be optionally substituted with 1–2 methyl groups; and $R_{12}$ and $R_{13}$ are each independently a group represented by the following formula:

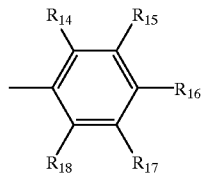

wherein $R_{14}$ is a fluorine atom, $-CF_3$ or $-CF_2CH_3$; and $R_{15}$, $R_{16}$, and $R_{17}$ and $R_{18}$ are each independently a hydrogen atom, a fluorine atom, $-CF_3$, $-CF_2CH_3$, an alkyl group of 1–12 carbon atoms, an alkoxy group of 1–12 carbon atoms, a 6-membered carbocyclic aromatic group or a 5- or 6-membered heterocyclic aromatic group.

2. A composition according to claim 1, wherein the photosensitive group contained in the photocuring resin (A) is (meth)acryloyl group, cinnamoyl group, allyl group, azido group or cinnamylidene group.

3. A composition according to claim 1, wherein the photocuring resin (A) has a number-average molecular weight of 1,000–100,000 and a glass transition temperature of −20° C. or above.

4. A composition according to claim 1, which comprises the sensitizer (B) in an amount of 0.1–10 parts by weight per 100 parts by weight (as solid content) of the photocuring resin (A).

5. A composition according to claim 1, wherein the titanocence compound (C) is a compound represented by the following formula:

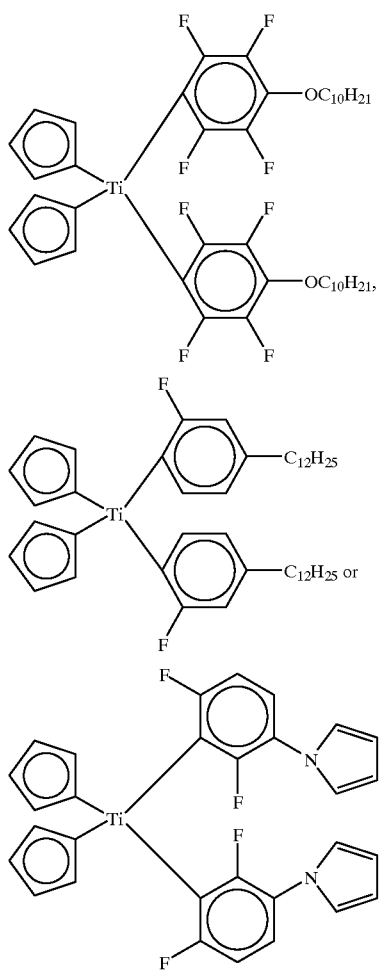

6. A composition according to claim 1, which comprises the titanocene compound (C) in an amount of 0.1–10 parts by weight per 100 parts by weight (as solid content) of the photocuring resin (A).

7. A composition according to claim 1, further comprising:

(D) at least one nitrogen-containing compound selected from the group consisting of the compounds represented by the following general formulas (1) to (6):

(1)

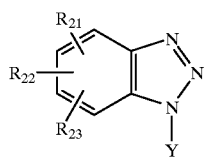

wherein Y is a hydrogen atom or a hydroxyl group; and $R_{21}$, $R_{22}$ and $R_{23}$ are each independently a hydrogen atom, a chlorine atom or an alkyl group of 1–6 carbon atoms, (2)

wherein $R_{24}$ and $R_{25}$ are each independently a hydrogen atom or an alkyl group of 1–6 carbon atoms, (3)

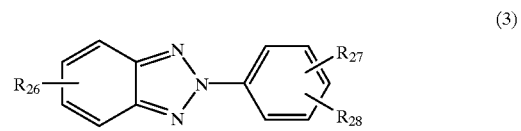

wherein $R_{26}$, $R_{27}$ and $R_{28}$ are each independently a hydrogen atom, a hydroxyl group or an alkyl group of 1–12 carbon atoms, (4)

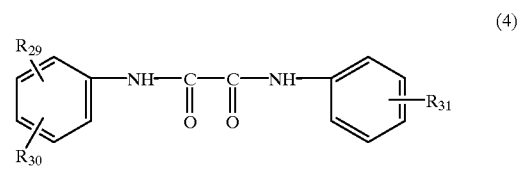

wherein $R_{29}$, $R_{30}$ and $R_{31}$ are each independently a hydrogen atom, a hydroxyl group, an alkyl group of 1–12 carbon atoms or an alkoxy group of 1–12 carbon atoms, (5)

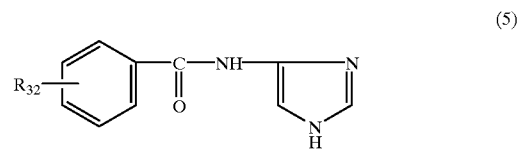

wherein $R_{32}$ is a hydrogen atom, a hydroxyl group, an alkyl group of 1–12 carbon atoms or an alkoxy group of 1–12 carbon atoms, and

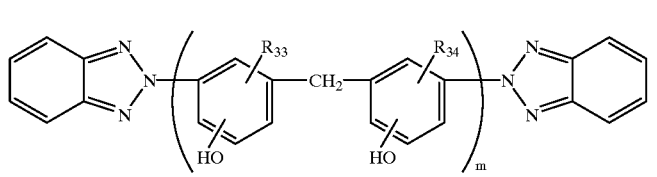

(6)

wherein $R_{33}$ and $R_{34}$ are each independently a hydrogen atom or an alkyl group of 1–12 carbon atoms; and m is an integer of 1–3.

8. A composition according to claim 7, wherein the nitrogen-containing compound (D) is selected from benzotriazoles of the general formula (1).

9. A composition according to claim 7, wherein the nitrogen-containing compound is contained in an amount of 0.01–20 parts by weight per 100 parts by weight (as solid content) of the photocuring resin (A).

10. A method for formation of an image, which comprises coating, on a substrate, a visible laser-curable composition of claim 1, exposing a visible laser image-wise to the resulting visible laser-curable film, and developing it.

* * * * *